United States Patent [19]
Kim

[11] Patent Number: 6,162,501
[45] Date of Patent: Dec. 19, 2000

[54] METHOD FOR MANUFACTURING THIN FILMS OF MULTI-ELEMENT GROUP OXIDE OR NITRIDE

[75] Inventor: Yeong-kwan Kim, Kyungki-do, Rep. of Korea

[73] Assignee: Samsung Electronics Co., Ltd., Suwon, Rep. of Korea

[21] Appl. No.: 09/239,777

[22] Filed: Jan. 29, 1999

[30] Foreign Application Priority Data

Mar. 17, 1998 [KR] Rep. of Korea .......................... 98-9062

[51] Int. Cl.⁷ .............................. C23C 16/40; C23C 16/34
[52] U.S. Cl. .............................. 427/255.32; 427/255.394; 427/99
[58] Field of Search ....................... 427/255.32, 255.394, 427/99; 438/680, 681

[56] References Cited

U.S. PATENT DOCUMENTS

| | | | |
|---|---|---|---|
| 4,992,306 | 2/1991 | Hochberg et al. | 427/255.3 |
| 5,431,958 | 7/1995 | Desu et al. | 427/255.3 |
| 5,670,218 | 9/1997 | Baek | 427/576 |
| 5,728,603 | 3/1998 | Emesh et al. | 437/235 |

FOREIGN PATENT DOCUMENTS 6-151383  5/1994  Japan .

*Primary Examiner*—Timothy Meeks
*Assistant Examiner*—Bret Chen
*Attorney, Agent, or Firm*—Jones Volentine, LLC

[57] ABSTRACT

A method of manufacturing thin films formed from multi-element group oxide includes supplying precursors containing elements later forming an oxide layer into a reaction chamber containing a semiconductor substrate on which an under-layer is formed, reacting an oxidizing gas supplied into the reaction chamber with the precursors to form the oxide layer on the under-layer, and supplying an organic ligand into the reaction chamber to improve planarity of the surface of the oxide layer.

24 Claims, 3 Drawing Sheets

METHOD FOR MANUFACTURING THIN FILMS OF MULTI-ELEMENT GROUP OXIDE OR NITRIDE

BACKGROUND OF THE INVENTION

The present invention relates to a method of manufacturing a semiconductor device. More particularly, the present invention relates to a method of manufacturing thin films formed from an oxide or a nitride composed of a group of three or more elements.

In the semiconductor field of art, and in particular semiconductor component development, compounds formed from a group of three or more elements have very promising performance characteristics. For example, a thin film formed from a multi-element group compound having a Perovskite crystal structure of excellent ferroelectric properties, such as $BaSrTiO_3$ (BST), can be used for a dynamic random access memory (DRAM) device, a ferroelectric random access memory (FRAM) device and a surface acoustic wave (SAW) device. Thus, much research is currently being conducted into methods for manufacturing a thin film structure comprised of a multi-element compound having excellent stoichiometry, crystallinity, uniformity and step coverage.

In order to obtain an acceptable thin film structure formed from a multi-element group compound, a method of manufacturing a thin film using a metal organic chemical vapor deposition (MOCVD) is typically required to obtain excellent step coverage, to control compound ratio, and to suppress radiation damage. In a surface kinetic regime, i.e., a region having a low deposition temperature, the MOCVD has excellent step coverage, but poor uniformity and poor layer stoichiometry. This is because the growth rate of each element in the multi-element group compound is very sensitive to the deposition temperature of the surface kinetic regime. Accordingly, it is very difficult to maintain the stoichiometric relationship required to complete composition of the various elements.

Further, in the surface kinetic regime, layer growth may occur in an environment wherein one or more precursor(s) are not completely decomposed. Thus, the possibility of contamination in the layer is quite high.

SUMMARY OF THE INVENTION

The present invention provides a method for manufacturing thin films formed from a multi-element group oxide or nitride having excellent step coverage and reduced impurities. In one aspect, the present invention provides a method of manufacturing a thin film formed from a multi-element group oxide, comprising the steps of: loading a semiconductor substrate on which an under-layer is formed into a reaction chamber; supplying precursors containing elements later forming an oxide layer into the reaction chamber; reacting an oxidizing gas supplied into the reaction chamber with the precursors to form the oxide layer on the under-layer; and supplying an organic ligand into the reaction chamber to improve planarity of the surface of the oxide layer.

Preferably, the organic ligand is hexafluoroacetylacetone (hfac), or acetylacetone (acac).

Alternatively, the method may further comprise the step of supplying a gas containing oxygen into the reaction chamber to remove impurities from the oxide layer, after supplying the organic ligand, and/or the step of forming an oxygen network layer for the oxide layer before the step of supplying the precursors into the reaction chamber.

The step of forming the oxygen network layer may comprise the substeps of supplying a precursor containing a metal element which is a base of a crystal lattice forming the oxide layer into the reaction chamber, and supplying a gas containing oxygen into the reaction chamber.

In another aspect, the present invention provides a method of manufacturing a thin film formed from a multi-element group nitride, comprising the steps of; loading a semiconductor substrate in which an under-layer is formed into a reaction chamber, supplying precursors containing metal elements for later forming a nitride layer into the reaction chamber, reacting a nitriding gas supplied into the reaction chamber with the precursors to form the nitride layer on the under-layer, and supplying an organic ligand into the reaction chamber to improve planarity of the surface of the nitride layer.

The foregoing alternatives set forth with respect to the multi-element group oxide may be applied to the multi-element group nitride. According to a method of manufacturing thin films formed from a multi-element group oxide or nitride according to the present invention, an oxidation process and an impurity removing process are performed during growth of the desired layer, so that thin films of multi-element group oxide and nitride having excellent step coverage and reduced impurities are manufactured to be used for a DRAM device, an FRAM device and a SAW device.

BRIEF DESCRIPTION OF THE DRAWINGS

The present invention with its attendant advantages will be better understood upon consideration of a detailed description of the preferred embodiment(s) with reference to the attached drawings in which.

DETAILED DESCRIPTION OF THE PREFERRED EMBODIMENTS

Figure 1:
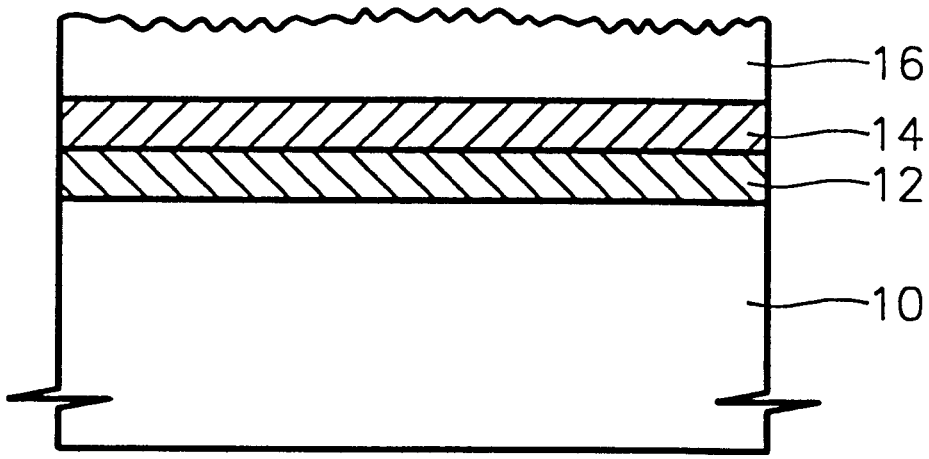
FIG. 1 is a sectional view showing an oxide layer without having performed a process of improving planarity according to the present invention.

Several embodiments of the present invention will now be described as teaching examples. Reference to the accompanying drawings may be had in which like reference numerals indicate like elements in preferred embodiments of the present invention. One of ordinary skill in the art will appreciate that the invention may, however, be embodied in many different forms and should not be construed as limited to the embodiments set forth herein. These embodiments are provided so that this disclosure will be thorough and complete, and will fully convey the scope of the invention to those skilled in the art. In the drawings, the thicknesses of layers and regions are exaggerated for clarity. Further, it will be understood that when a layer is referred to as being "on" or "over" another layer or substrate, it can be directly on or over the other layer or substrate, or intervening layers may be present.

Figure 2:
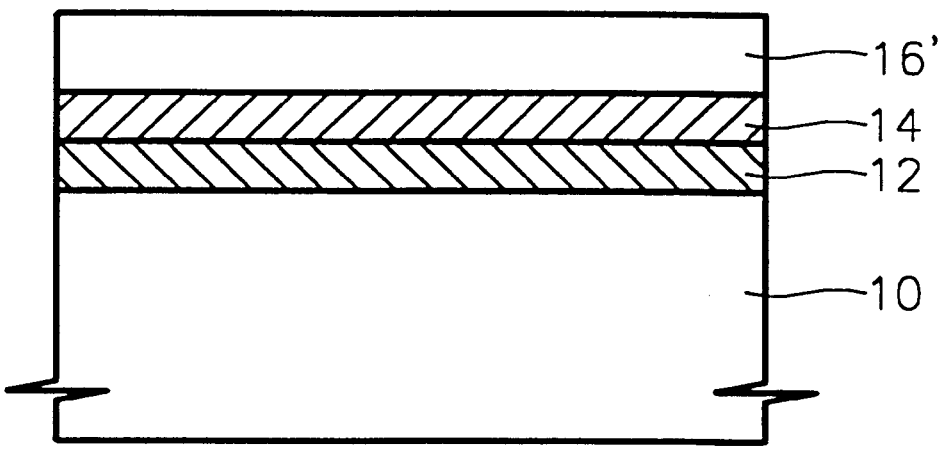
FIG. 2 is a sectional view showing the oxide layer of FIG. 1 having improved planarity.
Figure 3:
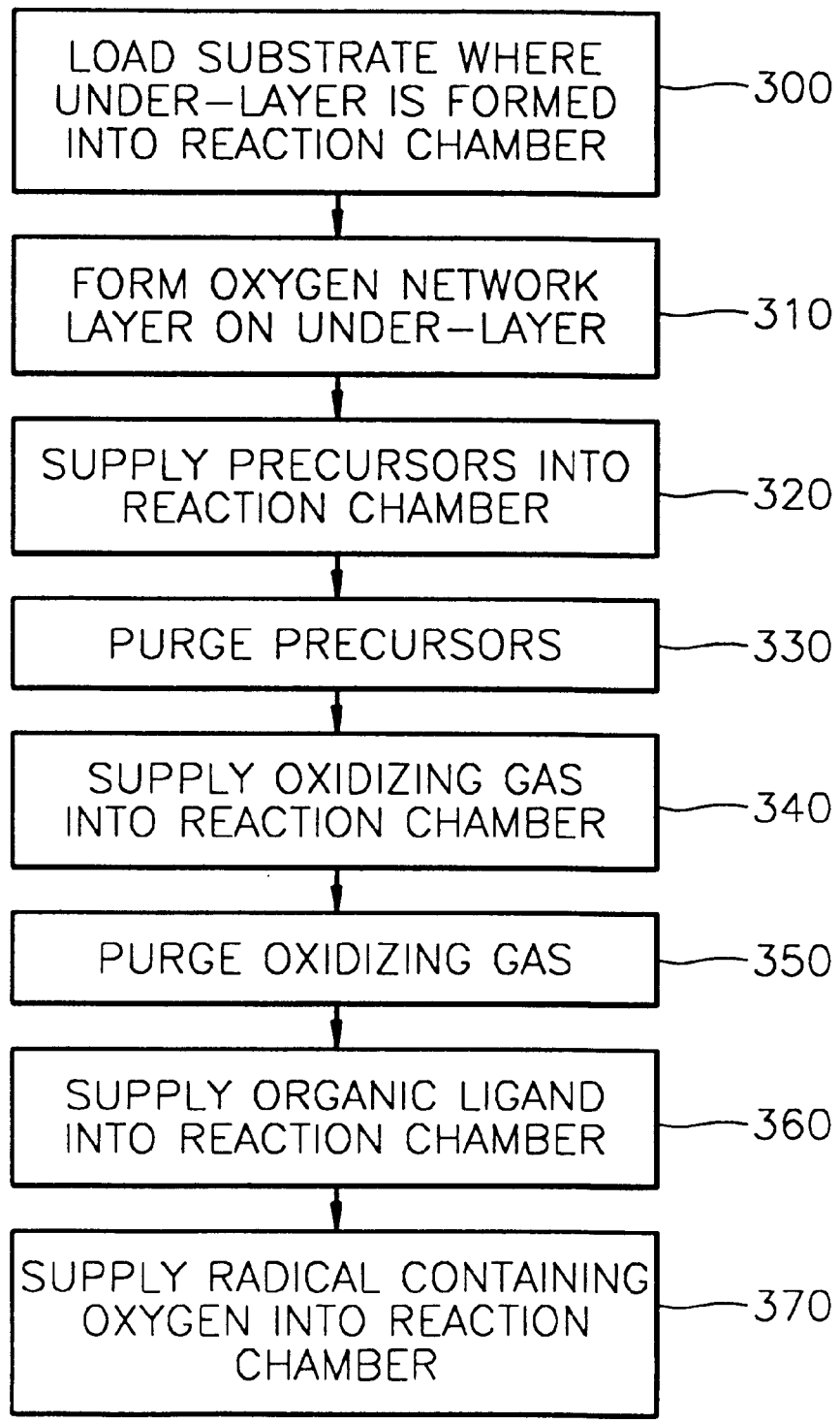
FIG. 3 is a flowchart showing a process of forming a thin film of a multi-group oxide according to the present invention.

A method of manufacturing a thin film formed from a multi-element group oxide according to the present invention will be described with reference to FIGS. 1, 2 and 3. For example, and as a way of conveniently expressing preferred embodiments, a three-element group oxide having the Perovskite structure, such as $SrTiO_3$ and $PbTiO_3$ is expressed by a chemical formula $ABO_3$. Here, A denotes a cation element having a great radius, B denotes a cation metal element having a small radius, and O denotes oxygen.

To begin, a semiconductor substrate 10 on which an under-layer 12 is formed is loaded into a reaction chamber (not shown) (step 300). Subsequently, precursors containing elements A and B are supplied into the reaction chamber in which no oxidizing gas is present, to thereby combine the precursors containing elements A and B on under-layer 12 (step 320). At this time, the supplied precursors may be completely or partially decomposed.

The three-element group oxide ($ABO_3$) may be more easily manufactured through stable formation of an oxygen network layer (i.e., a plurality of three-dimensional networks of $BO_6$). Thus, preferably, an oxygen network layer 14 for an oxide layer is formed on under-layer 12 to a thickness of approximately 0.5 to 100 Å (step 310), before forming a first interface with under-layer 12, i.e., before supplying the precursors into the reaction chamber. That is, preferably, the precursor containing an element (B) which is a base of a crystal lattice is supplied into the reaction chamber, and then a gas containing oxygen is supplied into the reaction chamber to form oxygen network layer 14 on under-layer 12, which easily causes a crystallizable reaction.

Next, an inert gas such as Ar or $N_2$ gas is supplied into the reaction chamber to purge the precursor remaining in the reaction chamber (step 330).

Also, in the state in which the precursors containing elements A and B are combined on under-layer 12, a radical containing $O_2$ or $O_3$, i.e., a reactive oxidizing gas, is supplied into the reaction chamber to form an oxide layer 16 on under-layer 12 (step 340).

Subsequently, an inert purge gas such as Ar or $N_2$ is supplied into the reaction chamber to purge the oxidizing gas remaining in the reaction chamber (step 350).

Meanwhile, oxide layer 16 may be formed by supplying the reactive oxidizing gas into the reaction chamber after supplying only one of the precursors containing elements A and B into the reaction chamber, and then supplying the reactive oxidizing gas into the reaction chamber again after supplying only the other one of the precursors containing elements B and A into the reaction chamber.

The surface of oxide layer 16 has poor planarity as shown in FIG. 1. Thus, an organic ligand such as hexafluoroacetylacetone (hfac) or acetylacetone (acac) is supplied into the reaction chamber to remove the remnants from the reaction chamber and enhance the planarity of the surface of oxide layer 16 (step 360). Here, if only the organic ligand is supplied to a thin film containing a metal, the metal has better volatility. As a result, a metal component remaining in the thin film can be removed. This method allows a metal to have a great vapor pressure, and uses a principle of manufacturing an organic metal compound. The organic ligand may remove an oxide containing an impurity such as carbon, as well as the remaining metal component. This is because a stable oxide layer has greater combination energy than an oxide layer containing an impurity. Thus, supply of the organic ligand allows a thin film having reduced impurities and a flat surface to be manufactured.

Also, a radical containing oxygen, such as $O_2$ or $O_3$, capable of easily combining with carbon, is supplied into the reaction chamber to remove an impurity such as carbon remaining in oxide layer 16 (step 370).

Accordingly, a planarized oxide layer 16' having a flat surface without impurities can be formed through the above process. Preferably, the thickness of planarized oxide layer 16' formed through one cycle as described above is approximately 3~100 Å, and a thicker layer may be formed by repeating the above cycle (steps 310~370). Meanwhile, in order to enhance crystallinity of the planarized oxide layer 16', annealing or a rapid thermal process (RTP) may be performed after formation of planarized oxide layer 16'.

Figure 4:
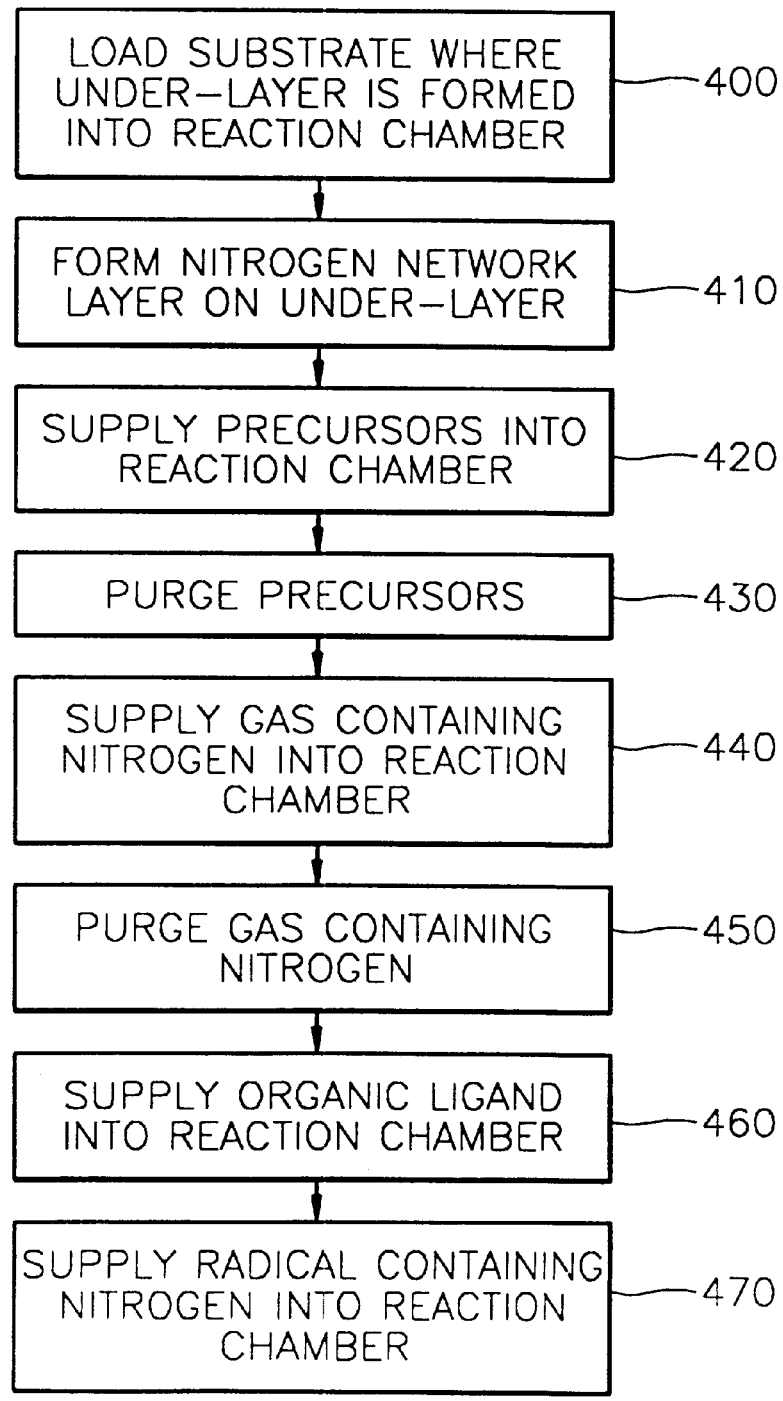
FIG. 4 is a flowchart showing a process of forming a thin film of a multi-group nitride according to the present invention.

Referring to FIG. 4, a method of manufacturing a thin film formed from a multi-element group nitride according to the present invention will be described. For convenience, a three-element group nitride, such as TiSiN and TaAlN, can be expressed by a chemical formula ABN. Here, A and B denote metal elements, and N denotes nitrogen.

A semiconductor substrate on which an under-layer is formed is loaded in a reaction chamber (step 400). Subsequently, precursors containing elements A and B are supplied into the reaction chamber in which no nitriding gas exists (step 420). Here, the supplied precursors may be completely or partially decomposed.

Meanwhile, the three-element group nitride having excellent crystallinity of ABN may be more easily manufactured by stably forming a nitrogen network layer (a nitride denoted by a compound of element B and nitrogen). Thus, before forming a first interface with an under-layer, i.e., before supplying the precursor into the reaction chamber, preferably, a nitrogen network layer for forming the nitride layer is formed to approximately 0.5~100 Å thick (step 410). That is, preferably, after supplying the precursor containing element B which is a base element of a crystal lattice forming a nitride layer, a gas containing nitrogen is supplied into the reaction chamber so that a nitrogen network layer is formed on the under-layer, to thereby cause an easily crystallizable reaction.

Also, an inert gas such as Ar or $N_2$ is supplied into the reaction chamber to purge precursors remaining in the reaction chamber (step 430).

In a state in which the precursors containing elements A and B are combined on the under-layer, a gas containing nitrogen such as $N_2$ or $NH_3$ or an $N_2$ radical is supplied into the reaction chamber to form a nitride layer (step 440).

Subsequently, an inert purge gas such as Ar or $N_2$ is supplied into the reaction chamber to purge a gas containing nitrogen remaining in the reaction chamber (step 450).

The above nitride layer may be formed by supplying a radical containing nitrogen into the reaction chamber after supplying only one of the precursors containing elements A and B into the reaction chamber, and then supplying a radical containing nitrogen into the reaction chamber after supplying only the other of the precursors containing elements B and A into the reaction chamber.

Then, the organic ligand such as hfac or acac is supplied into the reaction chamber to remove remnants remaining in the reaction chamber and enhance planarity of the surface of the nitride layer (step 460). Here, if only the organic ligand is supplied to a thin film containing a metal, the metal has higher volatility. As a result, the metal component remaining in the thin film can be removed. This method allows a metal to have a great vapor pressure, and uses a principle of manufacturing an organic metal compound. The organic ligand may remove an nitride containing impurities such as carbon, as well as the remaining metal component. This is because a stable nitride layer has greater combination energy than an nitride layer containing impurities. Thus, supply of the organic ligand allows a thin film having reduced impurities and a flat surface to be manufactured.

Also, a radical containing nitrogen, such as $NH_3$, capable of easily combining with carbon, is supplied into the reaction chamber to remove impurities such as carbon remaining in the nitride layer (step 470).

Accordingly, a layer having a flat surface and no impurities can be formed through the above process. Preferably, the thickness of the nitride layer formed through one cycle as described above is approximately 3~100 Å. A thicker layer can be obtained by repeating the cycle. Meanwhile, in order to enhance the crystallinity of the nitride layer, annealing or a rapid thermal process (RTP) may be performed after growing the layer.

As an example, a $SrTiO_3$ thin film according to the present invention is formed as follows:

A $SrTiO_3$ thin film was formed using $Sr(C_{11}H_{19}O_2)_2$ and $Ti(OC_3H_7)_4$ as precursors of Sr and Ti, by the above method of the present invention.

In order to obtain sufficient vapor pressure, a reservoir tank in which the $Sr(C_{11}H_{19}O_2)_2$ was filled was maintained at 175° C., and a reservoir tank in which $Ti(OC_3H_7)_4$ was filled was maintained at 21.5° C. In order to smoothly transfer the precursors into the reaction chamber, Ar was used as a carrier gas, and the flow rate of the Ar was maintained at 100 sccm (standard cubic centimeters).

The $Ti(OC_3H_7)_4$ transmitted by the carrier gas was supplied into the reaction chamber for three minutes, and then $O_3$ gas was supplied for 2 sec, to form an oxygen network layer on an under-layer formed on a semiconductor substrate in the reaction chamber.

Also, the precursors $Sr(C_{11}H_{19}O_2)_2$ and $Ti(OC_3H_7)_4$ were supplied into the reaction chamber for 10 sec, and a remnant was purged using Ar gas.

Subsequently, $O_3$ gas was supplied into the reaction chamber for 10 sec and a remnant was purged using the Ar gas.

An organic ligand hfac was supplied into the reaction chamber for 2 sec, and then $O_2$ gas was supplied for 5 sec in order to remove impurities from the layer.

During a process, temperature and pressure of the reaction chamber are maintained at 500° C. and 5 Torr, respectively. Thus, the $SrTiO_3$ thin film obtained was approximately 20 Å thick, and had excellent step coverage and uniformity.

In a method of manufacturing a thin film formed from a multi-element group oxide or nitride according to the present invention, an oxidation process and an impurity removing process are performed during growth of a layer, thereby providing excellent step coverage suitable for DRAM, FRAM or SAW devices, and resulting in the manufacture of thin film formed from a multi-element group oxide or nitride having reduced impurities.

Although the present invention has been described in detail above, various changes, substitutions and alterations thereto will become apparent to those of ordinary skill in the art. All such changes, substitutions and alterations are seen to be within the true spirit and scope of the invention as defined by the appended claims.

What is claimed is:

1. A method for manufacturing a thin film formed from a multi-element group oxide, comprising the steps of:
    (a) loading into a reaction chamber a semiconductor substrate on which an under-layer is formed;
    (b) supplying precursors containing elements for later forming an oxide layer, into the reaction chamber;
    (c) reacting an oxidizing gas supplied into the reaction chamber with the precursors to form an oxide layer on the under-layer; and
    (d) after the oxidizing gas has reacted with the precursor to form the oxide layer, supplying an organic ligand into the reaction chamber to improve planarity of the surface of the oxide layer.

2. The method of claim 1, wherein the organic ligand is hexafluoroacetylacetone (hfac).

3. The method of claim 1, wherein the organic ligand is acetylacetone (acac).

4. The method of claim 1, further comprising the step of supplying a gas containing oxygen into the reaction chamber to remove impurities from the oxide layer following step (d).

5. The method of claim 1, further comprising the step of forming an oxygen network layer for the oxide layer on the under-layer before step (b).

6. The method of claim 5, wherein the step of forming the oxygen network layer comprises the substeps of:
    supplying a precursor containing a metal element which is a base of a crystal lattice forming the oxide layer into the reaction chamber; and,
    supplying a gas containing oxygen into the reaction chamber.

7. The method of claim 1, further comprising the step of supplying a purging gas into the reaction chamber to purge the precursors remaining in the reaction chamber following step (b).

8. The method of claim 7, wherein the purging gas is one selected from the group consisting of Ar and $N_2$.

9. The method of claim 1, further comprising the step of supplying a purging gas into the reaction chamber to purge the oxidizing gas remaining in the reaction chamber following step (c).

10. The method of claim 9, wherein the purging gas is one selected from the group consisting of Ar and $N_2$.

11. The method of claim 1, further comprising the step of annealing the oxide layer following step (d).

12. The method of claim 1, further comprising the step of performing a rapid thermal process on the oxide layer following step (d).

13. A method of manufacturing a thin film formed from a multi-element group nitride, comprising the steps of:
    (a) loading into a reaction chamber a semiconductor substrate on which an under-layer is formed;
    (b) supplying precursors containing elements for later forming a nitride layer, into the reaction chamber;
    (c) reacting a nitriding gas supplied into the reaction chamber with the precursors to form a nitride layer on the under-layer; and
    (d) after the nitriding gas has reacted with the precursor to form the nitride layer, supplying an organic ligand into the reaction chamber to improve planarity of the surface of the nitride layer.

14. The method of claim 13, wherein the organic ligand is hexafluoroacetylacetone (hfac).

15. The method of claim 13, wherein the organic ligand is acetylacetone (acac).

16. The method of claim 13, further comprising the step of supplying a gas containing nitrogen into the reaction chamber to remove impurities from the nitride layer following step (d).

17. The method of claim 13, further comprising the step of forming a nitrogen network layer for the nitride layer prior to step (b).

18. The method of claim 17, wherein the step of forming the nitrogen network layer comprises the substeps of:
    supplying a precursor containing a metal element which is a base of a crystal lattice forming the nitride layer into the reaction chamber; and
    supplying a gas containing nitrogen into the reaction chamber.

19. The method of claim 13, further comprising the step of supplying a purging gas into the reaction chamber to purge the precursors remaining in the reaction chamber following step (b).

20. The method of claim 19, wherein the purging gas is one selected from the group consisting of Ar and $N_2$.

21. The method of claim 13, further comprising the step of supplying a purging gas into the reaction chamber to purge the nitriding gas remaining in the reaction chamber following step (c).

22. The method of claim 21, wherein the purging gas is one selected from the group consisting of Ar and $N_2$.

23. The method of claim 22, further comprising the step of annealing the nitride layer following step (d).

24. The method of claim 22, further comprising the step of performing a rapid thermal process on the nitride layer following step (d).

* * * * *